(12) United States Patent
Rice

(10) Patent No.: US 11,328,938 B2
(45) Date of Patent: *May 10, 2022

(54) SUBSTRATE PROCESSING APPARATUS AND METHODS WITH FACTORY INTERFACE CHAMBER FILTER PURGE

(71) Applicant: Applied Materials, Inc., Santa Clara, CA (US)

(72) Inventor: Michael R. Rice, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/008,075

(22) Filed: Aug. 31, 2020

(65) Prior Publication Data

US 2020/0402819 A1    Dec. 24, 2020

Related U.S. Application Data

(63) Continuation of application No. 15/905,959, filed on Feb. 27, 2018, now Pat. No. 10,763,134.

(51) Int. Cl.
| | |
|---|---|
| *B01D 46/70* | (2022.01) |
| *H01L 21/67* | (2006.01) |
| *H01L 21/673* | (2006.01) |
| *H01L 21/677* | (2006.01) |

(52) U.S. Cl.
CPC ........ *H01L 21/67017* (2013.01); *B01D 46/70* (2022.01); *H01L 21/67389* (2013.01); *H01L 21/67766* (2013.01); *H01L 21/67769* (2013.01); *H01L 21/67772* (2013.01); *B01D 2279/51* (2013.01); *H01L 21/67775* (2013.01)

(58) Field of Classification Search
CPC .......................... B01D 46/0067; B01D 50/00; B01D 2279/51; B65D 81/20; H01L 21/67017; H01L 21/67766; H01L 21/67389; H01L 21/67769; H01L 21/67772; H01L 21/67276; H01L 21/159
USPC ........ 55/385.1, 385.2; 454/57, 187; 206/710
See application file for complete search history.

(56) References Cited

U.S. PATENT DOCUMENTS

| | | |
|---|---|---|
| 6,996,453 B2 | 2/2006 | Ahn et al. |
| 10,159,169 B2 | 12/2018 | Wincent et al. |
| 10,192,765 B2 | 1/2019 | Koshti et al. |
| 10,262,884 B2 | 4/2019 | Bonecutter et al. |

(Continued)

FOREIGN PATENT DOCUMENTS

| | | |
|---|---|---|
| KR | 20040064326 A | 7/2004 |
| KR | 20100020968 A | 2/2010 |

(Continued)

OTHER PUBLICATIONS

International Search Report and Written Opinion dated Jun. 12, 2019, on application No. PCT/US2019/017637.

*Primary Examiner* — Minh Chau T Pham
(74) *Attorney, Agent, or Firm* — Lowenstein Sandler LLP

(57) ABSTRACT

A system includes a filter purge apparatus configured to supply a flushing gas to a portion of a factory interface chamber located upstream of a chamber filter to minimize moisture contamination of the chamber filter by ambient air. The filter purge apparatus is configured to supply the flushing gas in association with breach of the factory interface chamber which compromises controlled environment of the factory interface chamber.

20 Claims, 4 Drawing Sheets

(56) References Cited

U.S. PATENT DOCUMENTS

| | | | |
|---|---|---|---|
| 10,359,743 B2 | 7/2019 | Rice et al. | |
| 10,446,428 B2 | 10/2019 | Reuter | |
| 10,453,726 B2 | 10/2019 | Blahnik | |
| 10,453,727 B2 | 10/2019 | Bonecutter | |
| 10,541,165 B2 | 1/2020 | Reuter et al. | |
| 10,741,432 B2 | 8/2020 | Blahnik | |
| 10,763,134 B2* | 9/2020 | Rice | B01D 46/0067 |
| 2004/0105738 A1 | 6/2004 | Ahn et al. | |
| 2004/0187452 A1* | 9/2004 | Edo | B01D 53/265 |
| | | | 55/385.2 |
| 2005/0160705 A1* | 7/2005 | Bernard | H01L 21/67155 |
| | | | 55/385.1 |
| 2006/0156979 A1 | 7/2006 | Thakur et al. | |
| 2007/0144118 A1* | 6/2007 | Alvarez | H01L 21/67017 |
| | | | 55/385.1 |
| 2009/0129897 A1 | 5/2009 | Babbs et al. | |
| 2010/0178147 A1 | 7/2010 | Kremerman et al. | |
| 2012/0241032 A1 | 9/2012 | Sugawara | |
| 2012/0297981 A1* | 11/2012 | Burns | H01L 21/67376 |
| | | | 95/273 |
| 2015/0045961 A1 | 2/2015 | Koshti et al. | |
| 2015/0101482 A1 | 4/2015 | Chou et al. | |
| 2015/0170945 A1 | 6/2015 | Segawa et al. | |
| 2015/0340259 A1 | 11/2015 | Wakabayashi | |
| 2016/0118279 A1 | 4/2016 | Iyer et al. | |
| 2016/0147235 A1 | 5/2016 | Rice et al. | |
| 2016/0189993 A1 | 6/2016 | Nakagawa et al. | |
| 2016/0260628 A1 | 9/2016 | Ochiai | |
| 2017/0125270 A1 | 5/2017 | Choi et al. | |
| 2018/0047602 A1 | 2/2018 | Kawai et al. | |
| 2018/0124960 A1 | 5/2018 | Vincent et al. | |
| 2018/0130684 A1 | 5/2018 | Reuter et al. | |
| 2018/0130685 A1 | 5/2018 | Bonecutter et al. | |
| 2018/0130686 A1 | 5/2018 | Blahnik et al. | |
| 2018/0130687 A1 | 5/2018 | Bonecutter | |
| 2018/0226284 A1 | 8/2018 | Blahnik | |
| 2018/0269095 A1 | 9/2018 | Reuter | |
| 2018/0286726 A1 | 10/2018 | Rebstock | |
| 2018/0374733 A1 | 12/2018 | Pannese | |
| 2019/0362989 A1* | 11/2019 | Reuter | H01L 21/67766 |
| 2019/0362995 A1 | 11/2019 | Ito et al. | |

FOREIGN PATENT DOCUMENTS

| | | |
|---|---|---|
| KR | 20160133171 A | 11/2016 |
| TW | 201219102 A | 5/2012 |
| TW | 201519355 A | 5/2015 |
| TW | 201724325 A | 7/2017 |

\* cited by examiner

SUBSTRATE PROCESSING APPARATUS AND METHODS WITH FACTORY INTERFACE CHAMBER FILTER PURGE

RELATED APPLICATIONS

This application is a continuation of U.S. patent application Ser. No. 15/905,959, filed Feb. 27, 2018, now U.S. Pat. No. 10,763,134 B2, the entire content of which is hereby incorporated by reference.

FIELD

Embodiments relate to electronic device manufacturing, and more specifically to factory interface apparatus and methods including environmental controls.

BACKGROUND

Processing of substrates in semiconductor component manufacturing is carried out in process tools. Substrates travel between the process tools in substrate carriers (e.g., Front Opening Unified Pods or FOUPs) which can dock to a factory interface of the tool (otherwise referred to as an "equipment front end module (EFEM)"). The factory interface includes a factory interface chamber that can contain a load/unload robot that is operable to transfer substrates between the respective FOUPs docked to the factory interface and one or more process chambers. In some vacuum tools, substrates pass from the substrate carrier through the factory interface chamber to a load lock and then into a processing chamber for processing.

Recently, there has been a move in the semiconductor processing industry to control the environment within the factory interface, such as by supplying a purge gas (e.g., an inert gas) into the factory interface chamber or into the wafer FOUPs. However, such systems can suffer from performance problems.

Accordingly, factory interface apparatus and factory interface operating methods having improved capability are desired.

SUMMARY

In one aspect, a factory interface apparatus is provided. The factory interface apparatus includes a first wall having one or more load ports configured to dock one or more substrate carriers; additional walls forming a factory interface chamber, wherein at least one of the walls includes an access door configured to facilitate personnel access into the factory interface chamber; an environmental control system coupled to the factory interface chamber and configured to supply a purge gas to control one or more environmental conditions within the factory interface chamber during substrate transfer through the factory interface chamber; a chamber filter configured to filter the purge gas provided to factory interface chamber; and a filter purge apparatus configured to supply a flushing gas to the chamber filter when the access door is open in order to minimize moisture contamination of the chamber filter by ambient air.

In another aspect, a chamber filter purge apparatus is provided. The chamber filter purge apparatus includes a factory interface chamber including an access door; a chamber filter configured to filter purge gas provided to factory interface chamber; and a filter purge apparatus configured to supply a flushing gas to the chamber filter when the access door is open in order to minimize moisture contamination of the chamber filter from ambient air.

In a method aspect, a purge control method is provided. The purge control method includes providing a factory interface chamber having an access door configured to provide personnel servicing access into the factory interface chamber; providing a chamber filter configured to filter a flow of purge gas supplied to the factory interface chamber; and supplying a flushing gas to the chamber filter when the access door is open to minimize moisture contamination of the chamber filter by ambient air.

Numerous other aspects are provided in accordance with these and other embodiments of the disclosure. Other features and aspects of embodiments of the present disclosure will become more fully apparent from the following detailed description, the accompanying drawings, and the claims.

BRIEF DESCRIPTION FO THE DRAWINGS

The drawings, described below, are for illustrative purposes only and are not necessarily drawn to scale. The drawings are not intended to limit the scope of the disclosure in any way.

DETAILED DESCRIPTION

Figure 1:
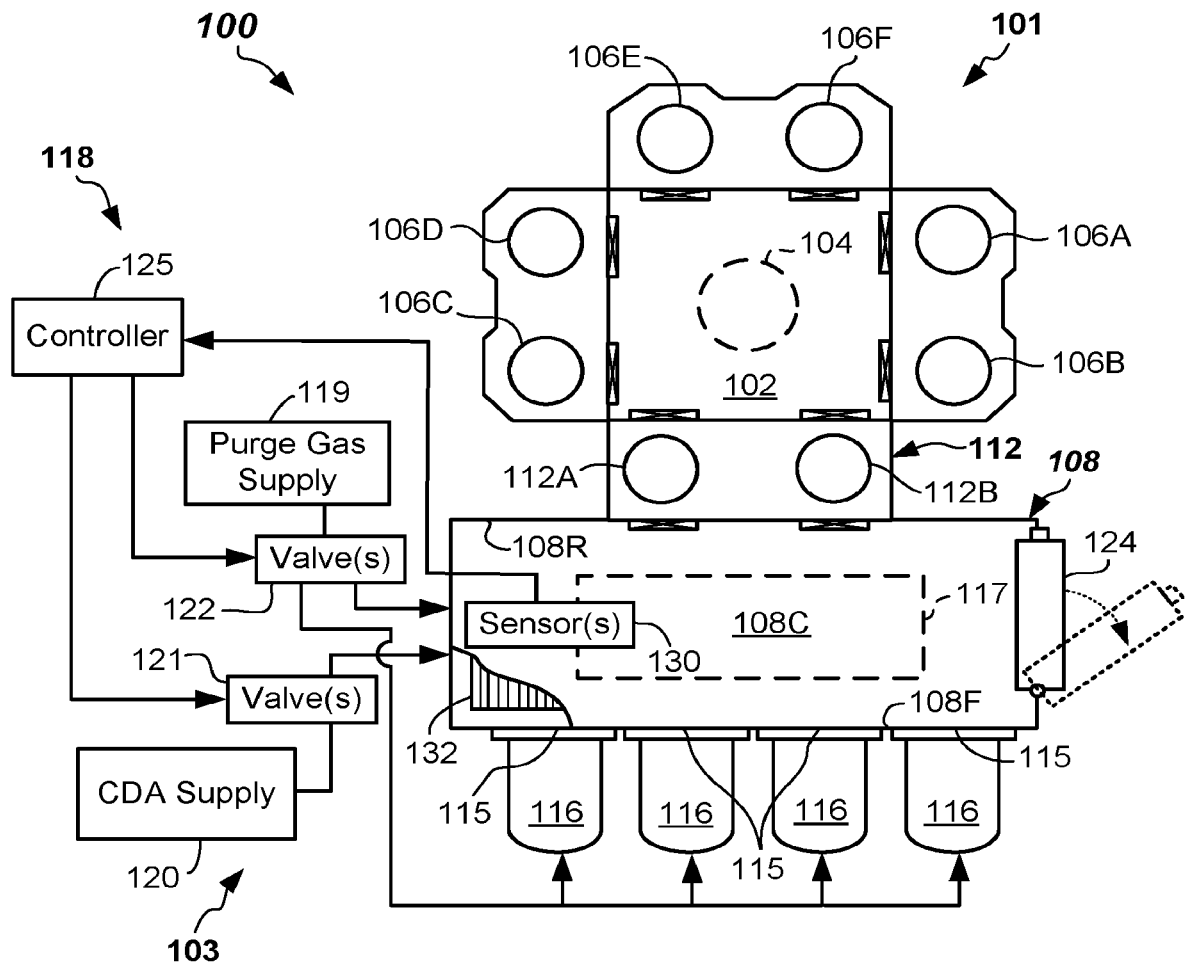
FIG. 1 illustrates a schematic top view of an electronic device processing apparatus including environmental control of a factory interface chamber and including a factory interface chamber filter purge capability according to one or more embodiments.

Reference will now be made in detail to the example embodiments, which are illustrated in the accompanying drawings. Wherever possible, the same reference numbers will be used throughout the drawings to refer to the same or like parts throughout the several views. Features of the various embodiments described herein may be combined with each other, unless specifically noted otherwise.

Existing electronic device manufacturing systems may suffer from problems when a high relative humidity level, high oxygen ($O_2$) level, high level of other chemical contaminant, too high temperature, or other environmental factors are observed. In particular, exposure of substrates to relatively high humidity levels, relatively high $O_2$ levels, or other chemical contaminants and particulates may adversely affect substrate properties.

Accordingly, certain electronic device processing apparatus provide efficiency and/or processing improvements in the processing of substrates by controlling environmental conditions to which the substrates are exposed to when in transit through the factory interface chamber. The factory interface receives substrates from one or more substrate carriers docked to a wall thereof (e.g., docked to a front wall thereof) and a load/unload robot can deliver the substrates for processing, such as to another opening (e.g., one or more load locks) in another wall of the factory interface (e.g., a rear wall thereof). In such factory interfaces with environmental controls, a purge gas (such as Argon (Ar), Nitrogen ($N_2$), or helium (He)) can be used to purge the air, moisture, and/or contaminants from the factory interface chamber.

One or more environmental parameters (e.g., relative humidity, temperature, an amount of 02, an amount of an inert gas, or an amount of a chemical contaminant) can be monitored and controlled by supplying the purge gas, and the opening of the respective FOUPs docked to the factory interface wall can be delayed until certain pre-conditions regarding the environment in a factory interface chamber are met.

However, at times, the factory interface chamber may be accessed by service personnel for servicing various components within the factory interface chamber, such as load port door openers, load/unload robot, slit valves, and the like. In such instances, an access door to the factory interface chamber is opened so that the service personal can perform the service. The flow of the purge gas is ceased during such servicing intervals.

As a result, the inventors hereof have discovered that the chamber filter that is configured to filter particulates from the purge gas can become contaminated with moisture during these service intervals because ambient air from the factory environment containing moisture (sometimes as high as 40% relative humidity at room temperature (RT)) is present in the factory interface chamber due to the access door being open.

To ameliorate one or more of the problems listed above, and in particular, chamber filter moisture contamination, factory interface apparatus, factory interface purge apparatus, and purge control methods are provided by the present disclosure.

Further details of example factory interface apparatus, factory interface purge apparatus, and purge control methods are described with reference to FIGS. 1-4 herein.

Figure 2:
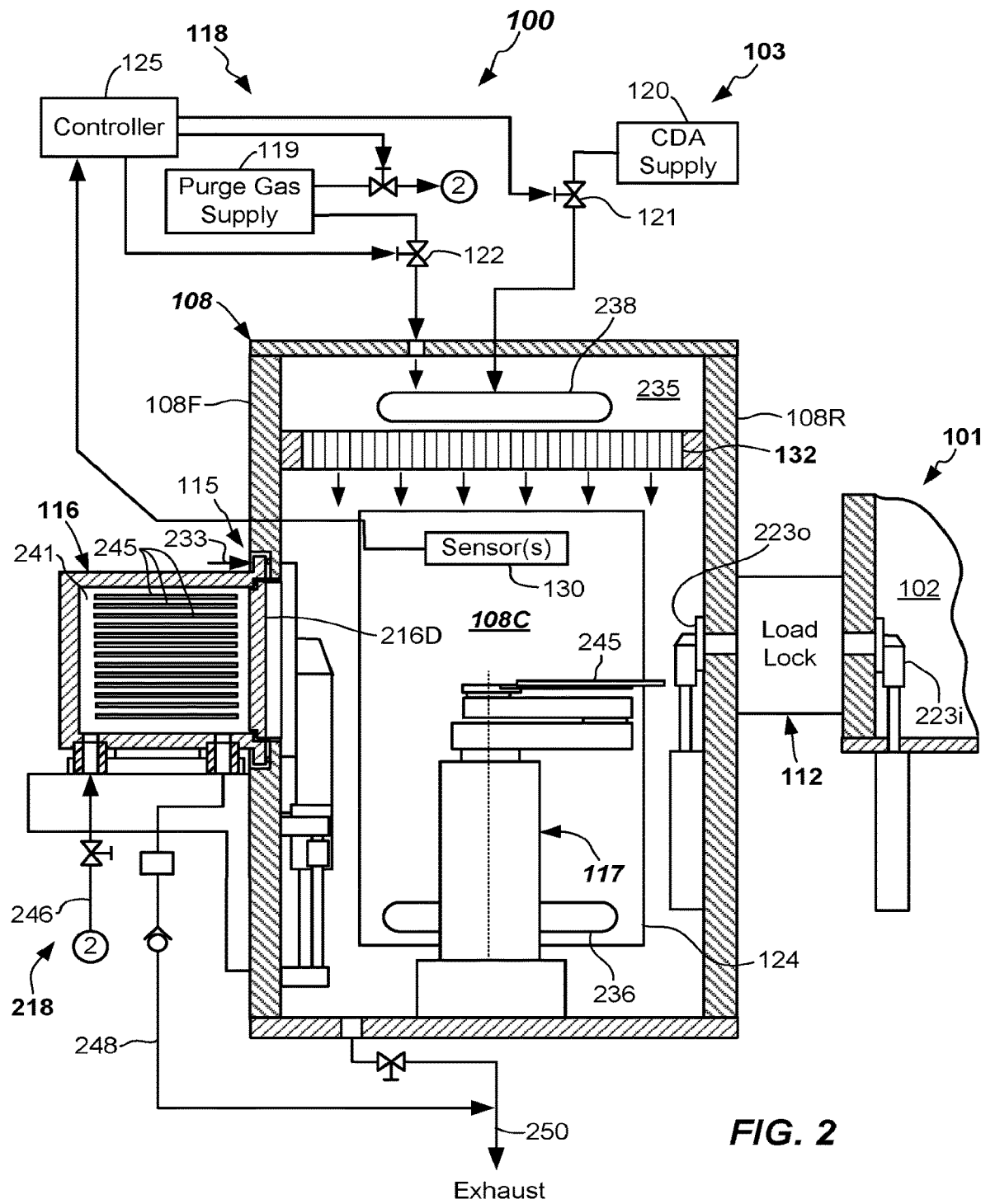
FIG. 2 illustrates a first partially cross sectioned side view of an electronic device processing apparatus including factory interface chamber filter purge capability according to one or more embodiments.
Figure 3:
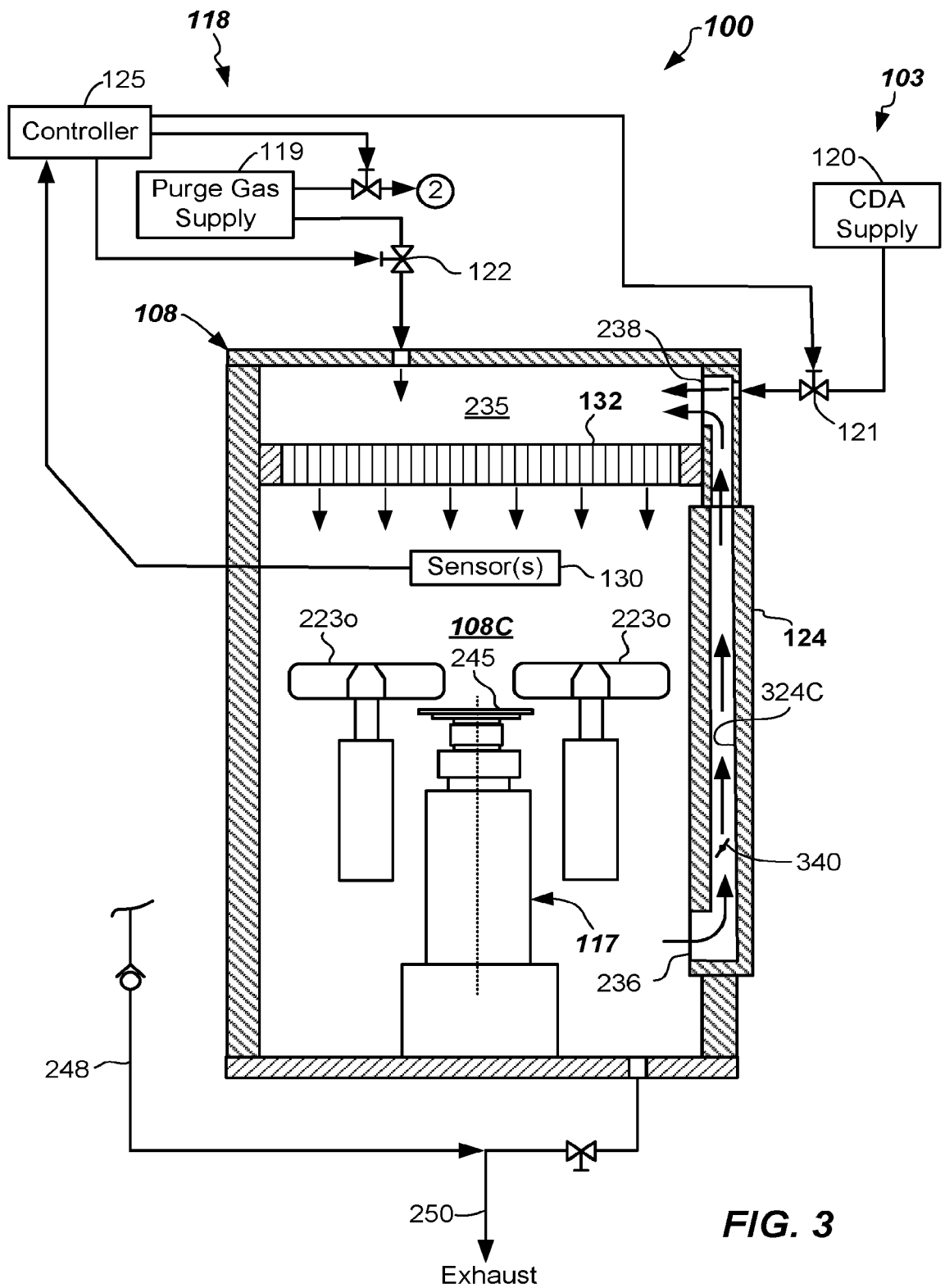
FIG. 3 illustrates another partially cross sectioned side view of an electronic device processing apparatus including factory interface chamber filter purge capability according to one or more embodiments.

FIGS. 1-3 illustrate schematic diagrams of an example embodiment of an electronic device processing apparatus 100 according to one or more embodiments of the present disclosure. The electronic device processing apparatus 100 may include a processing portion 101 configured to process substrates 245. The processing portion 101 can include mainframe housing having housing walls defining a transfer chamber 102. A transfer robot 104 (shown as a dotted circle in FIG. 1) may be at least partially housed within the transfer chamber 102. The transfer robot 104 may be configured and adapted to place or extract substrates 245 to and from process chambers 106A-106F via its operation. Substrates as used herein shall mean articles used to make electronic devices or circuit components, such as silica-containing discs or wafers, patterned or masked wafers, glass plates, or the like.

Transfer robot 104, in the depicted embodiment, may be any suitable type of robot adapted to service the various chambers (such as twin chambers shown) coupled to and accessible from the transfer chamber 102, such as the robot disclosed in US Patent Pub. No. 2010/0178147, for example. Other robot types may be used.

The motion of the various arm components of the transfer robot 104 may be controlled by suitable commands to a drive assembly (not shown) containing a plurality of drive motors of the transfer robot 104 as commanded from a robot controller (not shown). Signals from the robot controller cause motion of the various components of the transfer robot 104. Suitable feedback mechanisms may be provided for one or more of the components by various sensors, such as position encoders, or the like.

The transfer chamber 102 in the depicted embodiment may be generally square or slightly rectangular in shape. However, other suitable shapes of the mainframe housing and numbers of facets and processing chambers are possible, such as octagonal, hexagonal, heptagonal, octagonal, and the like. The destinations for the substrates may be one or more of the process chambers 106A-106F, which may be configured and operable to carry out one or more processes on the substrates delivered thereto. The processes carried out by process chambers 106A-106F may be any suitable process such as plasma vapor deposition (PVD) or chemical vapor deposition (CVD), etch, annealing, pre-clean, metal or metal oxide removal, or the like. Other processes may be carried out on substrates 245 therein.

The electronic device processing apparatus 100 can further include a factory interface 108 that includes environmental controls. Substrates 245 may be received into the transfer chamber 102 from a factory interface 108, and also exit the transfer chamber 102 to the factory interface 108 after processing thereof. Entry and exit to the transfer chamber 102 may be through an opening, or if a vacuum tool, through a load lock 112 that is coupled to a wall (e.g., a rear wall 108R) of the factory interface 108. The load lock 112 may include one or more load lock chambers (e.g., load lock chambers 112A, 112B, for example). Load lock chambers 112A, 112B included in the load lock 112 may be single wafer load locks (SWLL) chambers, or multi-wafer load lock chambers, or even batch load locks, and the like.

The factory interface 108 may be any suitable enclosure, and may have side walls (that may include the rear wall 108R, a front wall 108F opposite the rear wall 108R, two side walls, a top, and a bottom) forming a factory interface chamber 108C. One or more of the walls, such as side walls can include an access door 124 allowing servicing personnel to access the factory interface chamber 108C when a component within the factory interface chamber 108C is being serviced (repaired, changed, cleaned, or the like).

One or more load ports 115 may be provided on one or more of the walls (e.g., front wall 108F) of the factory interface 108 and may be configured and adapted to receive one or more substrate carriers 116 (e.g., front opening unified pods or FOUPs or the like) thereat. Factory interface chamber 108C may include a load/unload robot 117 (shown as a dotted box in FIG. 1) of conventional construction. Load/unload robot 117 may be configured and operational, once the carrier doors 216D of the substrate carriers 116 are opened, to extract substrates 245 from the one or more substrate carriers 116 and feed the substrates 245 through the factory interface chamber 108C and into one or more openings (e.g., the one or more load lock chambers 112A, 112B). Any suitable construction of the opening allowing transfer of substrates 245 between the factory interface chamber 108C and the processing chambers 106A-106F can be used. Any number of processing chambers and configurations thereof can be used.

In some vacuum embodiments, the transfer chamber 102 may include slit valves at an ingress/egress to the various process chambers 106A-106F. Likewise, load lock chambers 112A, 112B in the load lock 112 may include inner load lock slit valves 223i and outer load lock slit valves 223O. Slit valves 223O, 223i are adapted to open and close when placing or extracting substrates 245 to and from the various process chambers 106A-106F and load lock chambers 112A, 112B. Slit valves 223O, 223i may be of any suitable conventional construction, such as L-motion slit valves.

In the depicted embodiment, a factory interface environmental control apparatus 118 is provided. Factory interface environmental control apparatus 118 can provide environmental control of the gaseous environment within the factory interface chamber 108C by providing an environmentally-controlled atmosphere thereto during transfer of substrates 245 through the factory interface chamber 108C. In particular, factory interface environmental control apparatus 118 is coupled to the factory interface 108 and operational to monitor and/or control one or more environmental conditions within the factory interface chamber 108C.

In some embodiments, and at certain times, the factory interface chamber 108C may receive a purge gas therein. For example, the purge gas can be an inert gas, such as Argon (Ar), Nitrogen (N2), or helium (He). The purge gas can be supplied from a purge gas supply 119. Purge gas supply 119 may be coupled to the factory interface chamber 108C by any suitable means such as one or more conduits including valves 122, such as an on-off valve or mass flow controller therein. However, in some embodiments, where exposure of the substrate 245 to 02 is not a major concern, the purge gas can be clean dry air, such as provided from a clean dry air supply 120. Clean dry air as used herein is defined as air that is dry and contains few particulates. Clean dry air can include particulates no larger than 2 microns and can have a relatively lower relative humidity level as compared to ambient air in the factory environment outside of the factory interface chamber 108C. In particular, by one suitable measure, clean dry air can have a relative humidity level of 10% or less at room temperature. Further, clean dry air can have a relative humidity level of 5% or less at room temperature. In some embodiments, the clean dry air can be ultra clean dry air having less than 500 10 ppmV of H20, or even less than 100 ppmV of H20, or even less than 10 ppmV of H20 therein. In some embodiments, clean dry air can have particulates no larger than 0.05 microns.

In more detail, the factory interface environmental control apparatus 118 may control at least one of the following within the environment within the factory interface chamber 108C:
1) relative humidity level (% RH at room temperature),
2) temperature (T),
3) an amount of 02,
4) an amount of inert gas,
5) an amount of clean dry air, or
6) an amount of chemical contaminant (e.g., amines, bases, an amount of one or more volatile organic compound (VOC), or the like).

Other environmental conditions of the factory interface chamber 108C may be monitored and/or controlled, such as gas flow rate to or from the factory interface chamber 108C, chamber pressure within the factory interface chamber 108C, or both.

Factory interface environmental control apparatus 118 includes controller 125 including a suitable processor, memory, and electronic peripheral components configured and adapted to receive one or more signal inputs from one or more sensors 130 (e.g., relative humidity sensor, oxygen sensor, chemical component sensor, pressure sensor, flow sensor, temperature sensor, and/or the like) and control flow through the one or more valves 122 via a suitable control signal from controller 125.

Controller 125 may execute a closed loop or other suitable control scheme. In some embodiments, the control scheme may change a flow rate of the purge gas being introduced into the factory interface chamber 108C responsive to a measured condition from the one or more sensors 130. In another embodiment, the control scheme may determine when to transfer substrates 245 through the factory interface chamber 108C based upon one or more measured environmental conditions existing within the factory interface chamber 108C.

Factory interface environmental control apparatus 118 may, in one or more embodiments, monitor relative humidity (RH) by sensing any suitable measure of RH in the factory interface chamber 108C. The relative humidity sensor 130 may be configured and adapted to sense relative humidity (RH) in the factory interface chamber 108C. Any suitable type of relative humidity sensor may be used, such as a capacitive-type or other sensor. The RH sensor 130 may be located within the factory interface chamber 108C or within a conduit connected to the factory interface chamber 108C, for example. Controller 125 may monitor RH, and when a measured RH signal value provided to the controller 125 is above a predefined low RH threshold value, carrier doors 216D of the one or more substrate carriers 116 coupled to load ports 115 of the factory interface 108 will stay closed. Likewise, slit valve 2230 of the load lock 112 may be kept closed until the measured RH signal level below the predefined low RH threshold value is achieved. Other measures of humidity control may be measured and used as a predefined low RH threshold, such as ppmV of $H_2O$.

In one or more embodiments, the pre-defined low threshold RH value may be a moisture level less than 1,000 ppmV $H_2O$, less than 500 ppmV $H_2O$, less than 100 ppmV $H_2O$, or even less than 10 ppmV $H_2O$, depending upon the level of moisture that is tolerable for the particular process being carried out on the substrates 245.

The RH level may be lowered by flow of a suitable amount of a purge gas from the purge gas supply 119 into the factory interface chamber 108C. As described herein, the purge gas may be an inert gas from the purge gas supply 119 may be argon, nitrogen gas ($N_2$), helium, or mixtures thereof. A supply of dry nitrogen gas ($N_2$) may be quite effective at controlling environmental conditions within the factory interface chamber 108C. Compressed bulk inert gases having low $H_2O$ levels (as described herein) may be used as the purge gas supply 119. The supplied inert gas from the purge gas supply 119 may fill the factory interface chamber 108C during substrate processing when substrates 245 are being transferred through the factory interface chamber 108C.

In some instances, flow rates of purge gas provided into the factory interface chamber 108C may be monitored by a suitable flow sensor (not shown) on a delivery line and/or pressure sensor located within the factory interface chamber 108C, or both. Flow rates of 400 SLM or more may be provided by adjusting the valve 122 coupled to the purge gas supply 119 responsive to control signals from controller 125. Pressures of greater than about 500 Pa may be maintained within the factory interface chamber 108C, for example. Flow of the purge gas (e.g., $N_2$ or other inert gas) into the factory interface chamber 108C can be operative to lower the relative humidity (RH) level within the factory interface chamber 108C. The carrier door 216D and/or the load lock slit valves 223o of the one or more load lock chambers 112A, 112B may be opened when the low RH threshold value is met. This helps to ensure that substrates 245 exiting the substrate carriers 116, exiting the load lock chambers 112A, 112B, as well as any substrates 245 passing through the factory interface chamber 108C are exposed to only a suitably low humidity environment.

In another example, environmental preconditions may be met, for example, when a measured oxygen ($O_2$) level in the factory interface chamber 108C falls below a predefined level. Oxygen ($O_2$) level may be sensed by the one or more sensors 130, such as by an oxygen sensor. If the measured oxygen ($O_2$) level falls below a predefined oxygen threshold level (e.g., less than 50 ppm $O_2$, less than 10 ppm $O_2$, less than 5 ppm $O_2$, or even less than 3 ppm $O_2$, or even lower), then substrate exchange may take place through the factory interface chamber 108C. Other suitable oxygen level thresholds may be used, depending on the processing taking place. If the predefined oxygen threshold level in the factory interface chamber 108C is not met, the controller 125 will initiate a control signal to the valve 122 coupled to the purge gas supply 119 and flow purge gas into the factory interface chamber 108C until the predefined low oxygen threshold level is met, as determined by the controller 125 receiving signal from $O_2$ sensor 130.

When the predefined low oxygen threshold level is met, the carrier door 216D and/or the load lock slit valves 223o of the one or more load lock chambers 112A, 112B may be opened. This helps to ensure that substrates 245 exiting the substrate carriers 116, exiting the load lock chambers 112A, 112B, as well as any substrates 245 passing through the factory interface chamber 108C are exposed to relatively low oxygen levels.

In another example, environmental preconditions may be met, for example, when a measured temperature level in the factory interface chamber 108C, such as a temperature of a substrate 245 in the factory interface chamber 108C falls below a predefined temperature threshold level (e.g., less than 100 degrees C., or even lower). In one or more embodiments, the one or more sensors 130 includes a temperature sensor that is configured and adapted to sense a temperature within the factory interface chamber 108C. In some embodiments, the temperature sensor 130 may be placed in close proximity to a path of the substrate 245 as it passes through the factory interface chamber 108C on the load/unload robot 117. In some embodiments, the temperature sensor 130 may be a directional temperature sensor, such as a laser sensor that may be used to determine an extent to which the substrate 245 has been cooled. Once the predefined low temperature threshold level is met, the suitably cool substrate 245 may be loaded into a substrate carrier 116 for transport.

In another example, environmental preconditions may be met, for example, when a measured chemical contaminant level in the factory interface chamber 108C falls below a predefined low threshold level. In one or more embodiments, the one or more sensors 130 may include one or more chemical sensors that are configured and adapted to sense an amount of one or more chemical contaminants (e.g., amines, bases, an amount of one or more volatile organic compound (VOC), or the like) contained within the factory interface chamber 108C. In some embodiments, once a predefined chemical threshold level is met, the substrates 245 may be unloaded from a substrate carrier 116 or otherwise transported through the factory interface chamber 108C.

In the depicted embodiments herein, in addition to the factory interface environmental control apparatus 118, the electronic device processing apparatus 100 may further include a filter purge apparatus 103. Filter purge apparatus 103 includes a clean dry air supply 120 coupled to a portion of the factory interface chamber 108C. In particular, the clean dry air supply 120 may include a conduit and one or more valves 121 configured and adapted to control flow of a flushing gas such as clean dry air from the clean dry air supply 120 to a chamber filter 132 housed in the factory interface chamber 108C. The flushing gas comprising clean dry air flow can be coupled and provided to a plenum chamber 235, which is part of the factory interface chamber 108C and is located at a point upstream from the chamber filter 132. The chamber filter 132 separates the plenum chamber 235 from the portion of the factory interface chamber 108C that has substrates 245 passing there through.

The chamber filter 132 is configured to filter the purge gas provided to the processing region of the factory interface chamber 108 from the purge gas supply 119. In particular, the chamber filter 132 is a filter that includes the ability to filter very small particulates from the purge gas flow such that any particulates contained in the purge gas supply 119, supply conduits, and/or valves 122 are not exposed to the substrates 245 passing through the factory interface chamber 108C. The chamber filter 132 can be of any suitable construction, and may be a high Efficiency Filtered Air (HEPA) type filter, for example. HEPA filters can remove greater than 99.97% of particles of 0.3 microns in size or larger. However, various different classes of HEPA filters exist with particle filtering capabilities up to 99.9% or higher by the chamber filter 132.

Clean dry air supply 120 (CDA supply) can be the flushing gas and is a supply of air that has a relatively low level of moisture ($H_2O$) contained therein. CDA supply 120 may be coupled by suitable conduits and one or more valves 121, such as a mass flow controller or an on-off valve, to the factory interface chamber 108C, and in particular to the plenum chamber 235. By one measure, clean dry air is air having a relative humidity level that is less than 10% at room temperature, or even less than 5% at room temperature. By another measure, clean dry air is air having a relative humidity level that has less than 1000 ppmV $H_2O$, or even less than 100 ppmV $H_2O$, or even less than 10 ppmV $H_2O$ contained therein in some embodiments. In embodiments, clean dry air (CDA) has a relatively low level of moisture ($H_2O$) that will not appreciably affect the substrates 245 being transferred through the factory interface chamber 108C.

In more detail, the filter purge apparatus 103 is configured to supply a flushing gas to the chamber filter 132 when the access door 124 is open. Flushing gas can be a different gas than the purge gas in some embodiments. However, in other embodiments both the purge gas and the flushing gas may be the same clean dry air. The flow of the flushing gas can be initiated prior to opening the access door 124 and after terminating the purge gas flow from the purge gas supply 119. The flow of flushing gas from clean dry air supply 120 may continue to flow for the entire time that the access door 124 is open.

Flowing the flushing gas through the chamber filter 132 when the access door 124 is open can minimize contamination of the chamber filter 132 by humidity (moisture) that is contained in the ambient air entering into the factory interface chamber 108C through the access door 124 from the factory environment outside of the factory interface 108. In the depicted embodiment, the flushing gas can be clean dry air from the CDA supply 120. In one or more embodiments, the purge gas can be an inert gas from the purge gas supply 119 and the flushing gas can be clean dry air from the clean dry air supply 120. In one particularly effective embodiments, the purge gas can be an N2 gas from the purge gas supply 119 and the flushing gas can be clean dry air from the clean dry air supply 120. In other embodiments, the purge gas can be clean dry air and the flushing gas can be clean dry air.

In some embodiments, the access door 124 may include an interlock that allows the access door 124 to be opened only when a suitable environment is contained in the factory interface chamber 108C. For example, the interlock may be opened to allow the access door 124 to be opened after termination of a purge gas flow of inert gas from the purge gas supply 119 and initiation of the flushing gas flow (e.g., a clean and breathable gas) from the CDA supply 120 and when an oxygen sensor 130 that is configured and adapted to sense a level of oxygen ($O_2$) within or exiting the factory interface chamber 108C measures a value that is above a safe opening threshold value (e.g., a valve above about 20% $O_2$, for example) that is safe for personnel to be exposed to.

In one embodiment, when personnel seeks to enter the factory interface chamber 108C, and initiates an entry request, the controller 125 of the factory interface environmental control apparatus 118 may terminate the flow of the purge gas via a control signal to close valve 122 and initiate a flow of clean dry air from the CDA supply 120 via opening valve 121. During this transition, the inert gas environment is exhausted through exhaust 250 and is effectively replaced with clean dry air. Further, during this transition, the valve 340 in return channel 324C is closed. When a level of oxygen detected within the factory interface chamber 108C via sensor 130 reaches a predetermined oxygen level value that has been determined to be safe, the door interlock (e.g., an electromechanical lock) keeping an access door 124 closed may be unlatched to allow the access door 124 to be opened (as shown dotted in FIG. 1) and thus allow the servicing personnel to access to the factory interface chamber 108C for service of one or more components therein. The flow of clean dry air continues the entire time during the servicing.

As best seen in FIG. 3, a portion of the gas circulation route may be through the access door 124 at times. For example, the purge gas in the initial stages before opening the access door 124 may be into entrance 236 from the factory interface chamber 108C through a return channel 324C (e.g., a duct) formed in the access door 124 and then into the plenum chamber 235 through exit 238. The entrance 236 from the factory interface chamber 108C may be located at or near a bottom of the access door 124, for example.

When the access door 124 is closed after servicing), the valve 340 in the return path, such as in return channel 324C, remains closed and the flow of CDA air continues but is exhausted from the interface chamber 108C through exhaust 250 thus eventually displacing the moist air with it. This flow of clean dry air continues until the atmosphere in the factory interface chamber 108C is again acceptably dry. For example, CDA flow can be ceased and purge gas flow initiated after closure of the access door 124 only after a low threshold level of relative humidity (% RH at RT) is again achieved. Optionally, purge gas from purge gas supply 119 can be initiated as soon as the access door 124 is closed and the purge gas can displace the wet air to the exhaust 250. In this instance, valve 340 is close until the requisite low threshold of % RH at RT is achieved. After the pre-established low threshold of % RH at RT is achieved, the valve 340 can be opened and the recirculation of the purge gas through return channel 324C can occur.

In the depicted embodiment, the factory interface environmental control apparatus 118 may also include a carrier purge apparatus 218. Carrier purge apparatus 218 provides a flow of purge gas to carrier chambers 241 of the substrate carriers 116. Carrier purge apparatus 218 includes the purge gas supply (e.g., purge gas supply 119) and a plurality of supply conduits 246, 248 and valves coupled thereto. The plurality of supply conduits 246, 248 and valves supply purge gas to the carrier chambers 241 at certain times responsive to control signals from the controller 125. For example, the supply of purge gas may be provided to a carrier chamber 241 from purge gas supply 119 just prior to opening a carrier door 216D of a substrate carrier 116 in order to purge the environment within the substrate carrier 116 to meet certain environmental preconditions. Such environmental preconditions may be met before opening the substrate carrier door 216G allowing the transfer of substrates 245 from the substrate carrier 116 into the factory interface chamber 108C. Carrier purge apparatus 218 may include a set of supply conduits 246, 248 for each substrate carrier 116. Purge gas (e.g., inert gas) may be provided at a suitable flow rate (e.g., 1 slm) to purge the substrate carrier 116. After a suitable purge to control environmental conditions to a desired predefined low level (e.g., of % RH at RT), the carrier door 216D may be opened. The purging of the carrier chamber 241 may take place so that the carrier environment, which may contain undesirable levels of $O_2$, moisture, particles, or other volatile gases and materials, does not enter into and contaminate the factory interface chamber 108C.

In some embodiments, a face clamps 233 (denoted by arrow) may be included to engage the flange of the substrate carrier 116, such as at two or more locations (e.g., around the periphery). Face clamps 233 operate to seal the flange to the front wall 108F, such as to a load port back plate thereof. Any suitable face clamping mechanism may be used.

As will be apparent from the following, the use of the filter purge apparatus 103 in conjunction with the factory interface environmental control apparatus 118 may be operative to control the environment within the factory interface chamber 108C to meet certain environmental conditions, but may also allow the processing of substrates to resume more rapidly by ensuring that moisture contamination of the chamber filter 132 is minimized during servicing of the factory interface 108. Accordingly, after servicing of a component in the factory interface chamber 108C, time to resume processing of substrates 245 may be appreciably shortened, such as to about less than about 4 hours, or even less than about 1 hour after access door 124 closure.

Figure 4:
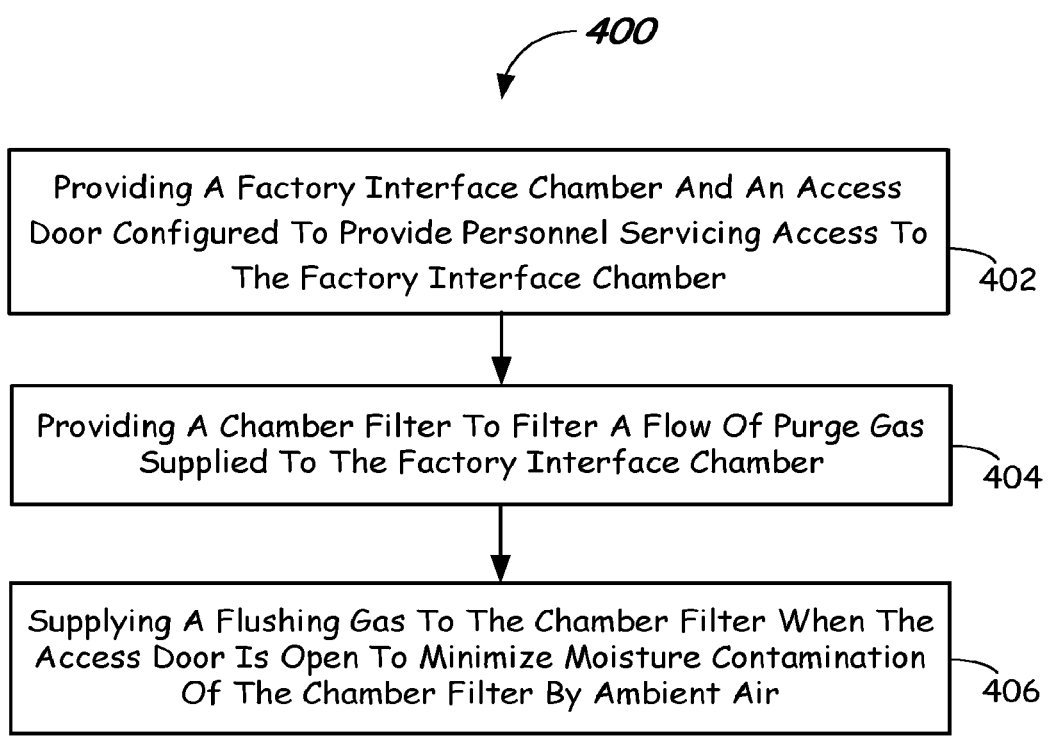
FIG. 4 illustrates a flowchart depicting a purge control method according to one or more embodiments.

Referring now to FIG. 4, a purge control method will be described. The purge control method 400 includes, in 402, providing a factory interface chamber (e.g., factory interface chamber 108C) having an access door (e.g., access door 124) configured to provide personnel servicing access into the factory interface chamber.

The method 400 includes, in 404, providing a chamber filter (e.g., chamber filter 132) configured to filter a flow of purge gas supplied to the factory interface chamber.

The method 400 further includes, in 406, supplying a flushing gas to the chamber filter when the access door is opened to minimize moisture contamination of the chamber filter by ambient air (e.g., high humidity factory air). As stated above, the flowing of the flushing gas through the chamber filter 132 may take place an entire time when the access door 124 is open. Moreover, the flow of the purge gas supplied to the factory interface chamber can be terminated prior to the supplying the flushing gas. In some embodiments, once the flushing gas (e.g., clean dry air) is provided to the plenum chamber 235, the access door 124 can be opened after a threshold high level of oxygen in the factory interface chamber 108C is reached. Resumption of substrate 245 transfer after closure of the access door 124 occurs only after a predefined low level of relative humidity (% RH at room temperature) in the factory interface chamber 108C is reached.

The foregoing description discloses only example embodiments of the disclosure. Modifications of the above-disclosed apparatus and methods that fall within the scope of the disclosure will be readily apparent to those of ordinary skill in the art. Accordingly, it should be understood that other embodiments may fall within the scope of the disclosure, as defined by the claims.

What is claimed is:

1. A system comprising:
a filter purge apparatus configured to supply to a factory interface chamber:
 a purge gas to control one or more environmental conditions within the factory interface chamber; and
 a flushing gas, supplied in association with opening a port of the factory interface chamber, to a portion of the factory interface chamber located upstream of a chamber filter to minimize moisture contamination of the chamber filter by ambient air, wherein the opening of the port compromises a controlled environment of the factory interface chamber.

2. The system of claim 1 further comprising:
memory; and
a processor coupled to the memory, wherein the processor is to:
 receive, from one or more sensors, sensor data associated with the factory interface chamber; and
 cause, based on the sensor data, the filter purge apparatus to supply the flushing gas to the portion of the factory interface chamber located upstream of the chamber filter.

3. The system of claim 2, wherein the processor is further to:
cause a flow of the purge gas to the factory interface chamber during transferring of one or more substrates in the factory interface chamber; and
terminate, based on the sensor data, the flow of the purge gas into the factory interface chamber.

4. The system of claim 2, wherein the sensor data is indicative of the opening of the port of the factory interface chamber which compromises the controlled environment of the factory interface chamber.

5. The system of claim 2, wherein the processor is further to:
subsequent to supplying the flushing gas to the portion of the factory interface chamber, receive second sensor data; and
responsive to determining that the second sensor data meets a threshold value, permit the opening of the port of the factory interface chamber.

6. The system of claim 1 further comprising:
memory; and
a processor coupled to the memory, wherein the processor is to:
 receive a chamber access request;
 terminate, based on the chamber access request, flow of the purge gas into the factory interface chamber; and
 cause, based on the chamber access request, the filter purge apparatus to supply the flushing gas.

7. The system of claim 2, wherein the sensor data comprises one or more of humidity data, flow data, pressure data, temperature data, oxygen data, inert gas data, or chemical contaminant data.

8. A method comprising:
receiving, by a processor from one or more sensors, sensor data associated with a factory interface chamber; and
causing, by the processor based on the sensor data, a filter purge apparatus to supply to the factory interface chamber:
 a purge gas to control one or more environmental conditions within the factory interface chamber; and
 a flushing gas supplied in association with opening a port of the factory interface chamber to a portion of the factory interface chamber located upstream of a chamber filter to minimize moisture contamination of the chamber filter by ambient air, wherein the opening of the port compromises a controlled environment of the factory interface chamber.

9. The method of claim 8 further comprising:
determining, based on the sensor data, the opening of the port of the factory interface chamber which compromises the controlled environment of the factory interface chamber, wherein the causing of the filter purge apparatus to supply the flushing gas is responsive to the determining of the opening of the port.

10. The method of claim 8 further comprising:
causing a flow of the purge gas to the factory interface chamber during transferring of one or more substrates in the factory interface chamber; and
terminating, based on the sensor data, the flow of the purge gas into the factory interface chamber.

11. The method of claim 8 further comprising:
subsequent to supplying the flushing gas to the portion of the factory interface chamber, receiving second sensor data; and
responsive to determining that the second sensor data meets a threshold value, permitting the opening of the port of the factory interface chamber.

12. The method of claim 8, wherein the sensor data comprises one or more of humidity data, flow data, pressure data, temperature data, oxygen data, inert gas data, or chemical contaminant data.

13. The method of claim 8 further comprising:
receiving a chamber access request; and
terminating, based on the chamber access request, flow of the purge gas into the factory interface chamber, wherein the causing of the filter purge apparatus to supply the flushing gas is further based on the chamber access request.

14. The method of claim 8, wherein the opening of the port of the factory interface chamber comprises opening of a personnel access door of the factory interface chamber.

15. A system comprising:
a factory interface chamber;
a chamber filter disposed in the factory interface chamber; and
a filter purge apparatus configured to supply:
 a purge gas to control one or more environmental conditions within the factory interface chamber; and
 a flushing gas supplied in association with opening a port of the factory interface chamber, to a portion of the factory interface chamber located upstream of the chamber filter to minimize contamination of the chamber filter, wherein the opening of the port compromises a controlled environment of the factory interface chamber.

16. The system of claim 15 further comprising:
memory; and
a processor coupled to the memory, wherein the processor is to:
 receive, from one or more sensors, sensor data associated with the factory interface chamber; and
 cause, based on the sensor data, the filter purge apparatus to supply the flushing gas to the portion of the factory interface chamber located upstream of the chamber filter.

17. The system of claim 16, wherein the processor is further to:
  cause a flow of the purge gas to the factory interface chamber during transferring of one or more substrates in the factory interface chamber; and
  terminate, based on the sensor data, the flow of the purge gas into the factory interface chamber.

18. The system of claim 16, wherein the sensor data is indicative of the opening of the port of the factory interface chamber which compromises the controlled environment of the factory interface chamber.

19. The system of claim 16, wherein the processor is further to:
  subsequent to supplying the flushing gas to the portion of the factory interface chamber, receive second sensor data; and
  responsive to determining that the second sensor data meets a threshold value, permit the opening of the port of the factory interface chamber.

20. The system of claim 15 further comprising:
  memory; and
  a processor coupled to the memory, wherein the processor is to:
    receive a chamber access request;
    terminate, based on the chamber access request, flow of the purge gas into the factory interface chamber; and
    cause, based on the chamber access request, the filter purge apparatus to supply the flushing gas.

* * * * *